(12) United States Patent
Lee

(10) Patent No.: US 7,319,517 B2
(45) Date of Patent: Jan. 15, 2008

(54) WAFER CHUCK ILLUMINATION DEVICE FOR USE IN SEMICONDUCTOR MANUFACTURING EQUIPMENT

(75) Inventor: Sang-Bong Lee, Daegu-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 325 days.

(21) Appl. No.: 10/999,310

(22) Filed: Nov. 30, 2004

(65) Prior Publication Data

US 2005/0121625 A1 Jun. 9, 2005

(30) Foreign Application Priority Data

Dec. 3, 2003 (KR) ...................... 10-2003-0087061

(51) Int. Cl.
*G01N 21/00* (2006.01)

(52) U.S. Cl. .................................. 356/237.2

(58) Field of Classification Search ............... 356/237.2
See application file for complete search history.

(56) References Cited

U.S. PATENT DOCUMENTS

| 5,274,434 | A | * | 12/1993 | Morioka et al. | ......... 356/237.4 |
| 5,414,515 | A | * | 5/1995 | Kawashima | ................. 356/623 |
| 5,432,607 | A | * | 7/1995 | Taubenblatt | ................. 356/364 |
| 5,463,459 | A | * | 10/1995 | Morioka et al. | ......... 356/237.5 |
| 5,886,432 | A | * | 3/1999 | Markle | ........................ 310/12 |
| 2002/0018217 | A1 | * | 2/2002 | Weber-Grabau et al. | .... 356/601 |
| 2002/0191180 | A1 | * | 12/2002 | Takeishi | .................. 356/237.3 |
| 2004/0207836 | A1 | * | 10/2004 | Chhibber et al. | ........ 356/237.4 |

* cited by examiner

*Primary Examiner*—Gregory J. Toatley, Jr.
*Assistant Examiner*—Jonathan Skovholt
(74) *Attorney, Agent, or Firm*—F. Chau & Assoc., LLC

(57) ABSTRACT

A wafer chuck illumination device for illuminating a light source to detect a position of foreign substances polluting a wafer chuck is provided. The device includes a lamp for generating a white light source, and a collimator lens for transforming the white light source into a beam of parallel rays and for directing the beam of parallel rays to a wafer chuck for detecting and cleaning foreign substances on the wafer chuck.

15 Claims, 6 Drawing Sheets

WAFER CHUCK ILLUMINATION DEVICE FOR USE IN SEMICONDUCTOR MANUFACTURING EQUIPMENT

TECHNICAL FIELD

The present invention relates to semiconductor manufacturing equipment, and more particularly, to a wafer chuck illumination device for illuminating a light source to detect foreign substances polluting a wafer chuck.

DISCUSSION OF THE RELATED ART

In order to selectively remove photoresist and simultaneously etch semiconductor wafer and then form a pattern thereon after depositing the photoresist on the semiconductor wafer, an exposure device is used to remove the photoresist from the semiconductor wafer.

Generally, an exposure device requires a resolution over 0.3 µm and an adequate depth-of-focus to manufacture a highly integrated semiconductor device. For example, to form a sub-half micron pattern, certain devices and techniques are used, including an excimer laser for reducing a light source's wavelength, an exposure method using a phase-inversion mask, and a transform or tiled illumination method. The transform illumination method is disclosed in U.S. Pat. No. 5,446,587.

In a prior art exposure device, a light source penetrates first and second filters and an input lens positioned between the first and second filters by passing through a change mirror of a first light path. The light also penetrates a first lens and a relay lens, and is reflected to a change mirror of a second light path. The two lenses are respectively used to prevent an arcing portion of the light from being darkened by an ultraviolet (U.V.) lamp and irradiate light penetrated through a front end lens of, for example, the relay lens. The relay lens is also used to control a focal point of the light source to improve a focal point of an image. The light reflected from the second light path mirror is passed through a condenser lens through which the light source penetrates uniformly and in parallel, a reticle and projection lens, and then is exposed to a wafer positioned on a stage.

As shown in FIG. 1, in order to align wafers in an exposure device, light generated from a superhigh temperature mercury lamp is irradiated to align a reticle 18, and the light is then irradiated to a third scope 20 to sense a tilt of the reticle 18. First and second halogen lamps 10 and 12 perform an auto global alignment (AGA) measurement. Light generated from the first halogen lamp 10 is reflected through a first scope 14 and a first reflection mirror 36, and light generated from the second halogen lamp 12 is reflected to a second reflection mirror 38 through a second scope 16. The light reflected through the first and second reflection mirrors 36 and 38 is illuminated to an alignment mark of a wafer 26 through a projection lens 22. The light reflected from the alignment mark is again reflected through the first and second reflection mirrors 36 and 38. The light reflected through the first and second reflection mirrors 36 and 38 is transferred to the first and second scopes 14 and 16 to sense a tilt of an X-Y stage 24.

In the exposure device a wafer chuck for safely receiving wafers may be polluted with foreign substances such as several kinds of polymers. When the wafer chuck is polluted, a partial focus defect is generated in an exposure procedure. In other words, a pattern is partially distorted or collapses. Thus, the wafer chuck should be cleaned to prevent the defect. However, the interior of the exposure device is dark, and a wafer stage where the wafer chuck is located is in a stand-by position or an initial position. Thus, in order to clean the wafer chuck, the wafer stage must be moved to a working position.

As the wafer chuck is in a dark state one can detect whether foreign substances exist thereon by observing the surface of the wafer chuck by projecting light onto the wafer chuck. However, when an instrument such as a flashlight is used to illuminate the surface of the wafer chuck it is difficult to observe the existence of foreign substances and to determine whether to clean the wafer chuck. Furthermore, the interior of the exposure device may be damaged by mistakenly using a flashlight to observe pollutants.

SUMMARY OF THE INVENTION

A wafer chuck illumination device which is capable of automatically irradiating light on a wafer chuck to perform a cleaning operation for the wafer chuck is provided. The device prevents the interior of semiconductor manufacturing equipment from being damaged by automatically irradiating light on the wafer chuck without using an instrument such as a flashlight.

One aspect of the present invention provides a wafer chuck illumination device for use in semiconductor manufacturing equipment, including a lamp that is installed on an equipment inner wall and that generates a white light source and irradiates the white light source to a wafer chuck.

Another aspect of the present invention provides a wafer chuck illumination device for use in semiconductor manufacturing equipment, including a lamp that is installed on an equipment inner wall and that generates a white light source, and a collimator lens for transforming the white light source generated from the lamp to a beam of parallel rays and for penetrating the beam of parallel rays through the wafer chuck.

The beam of parallel rays penetrated from the collimator lens is diffusedly reflected by foreign substances of the wafer chuck, thus a user can check a position of the foreign substances. Herewith, at least one lamp and collimator lens may be installed.

Another aspect of the present invention provides a wafer chuck illumination device for use in semiconductor manufacturing equipment, including a wafer stage for transferring a wafer chuck to a cleaning working position, the wafer stage being provided with the wafer chuck on which wafers for an exposure are mounted, at least one lamp that is installed on an equipment inner wall and that generates a white light source, and at least one collimator lens for transforming the white light source irradiated from the lamp to a beam of parallel rays and for penetrating the beam of parallel rays through the wafer chuck.

Another aspect of the invention provides a wafer chuck illumination device, including a wafer stage, which is provided with a wafer chuck on which wafers for an exposure are mounted, and which moves the wafer chuck forward and backward, right and left, upward and downward and in a tilt direction, etc. to an exposure working position or a cleaning working position; a controller for outputting a lamp drive signal after moving the wafer stage to the cleaning position when a drive command for cleaning the wafer chuck is performed; at least one lamp that is installed on an equipment inner wall and that generates a white light source in response to the lamp drive signal of the controller; and a monitor for displaying on a screen several kinds of commands under control of the controller and for providing the controller with the command selected on the screen.

Another aspect of the invention provides a wafer chuck illumination device for use in semiconductor manufacturing equipment, including a lamp that is installed on an equipment inner wall and that generates a white light source, a collimator lens for transforming the light source generated from the lamp to a beam of parallel rays and for penetrating the beam of parallel rays through the wafer chuck, and a switch for turning the lamp on or off.

BRIEF DESCRIPTION OF THE DRAWINGS

Exemplary embodiments of the invention are described with reference to the accompanying drawings, of which.

DETAILED DESCRIPTION OF THE INVENTION

Figure 1:
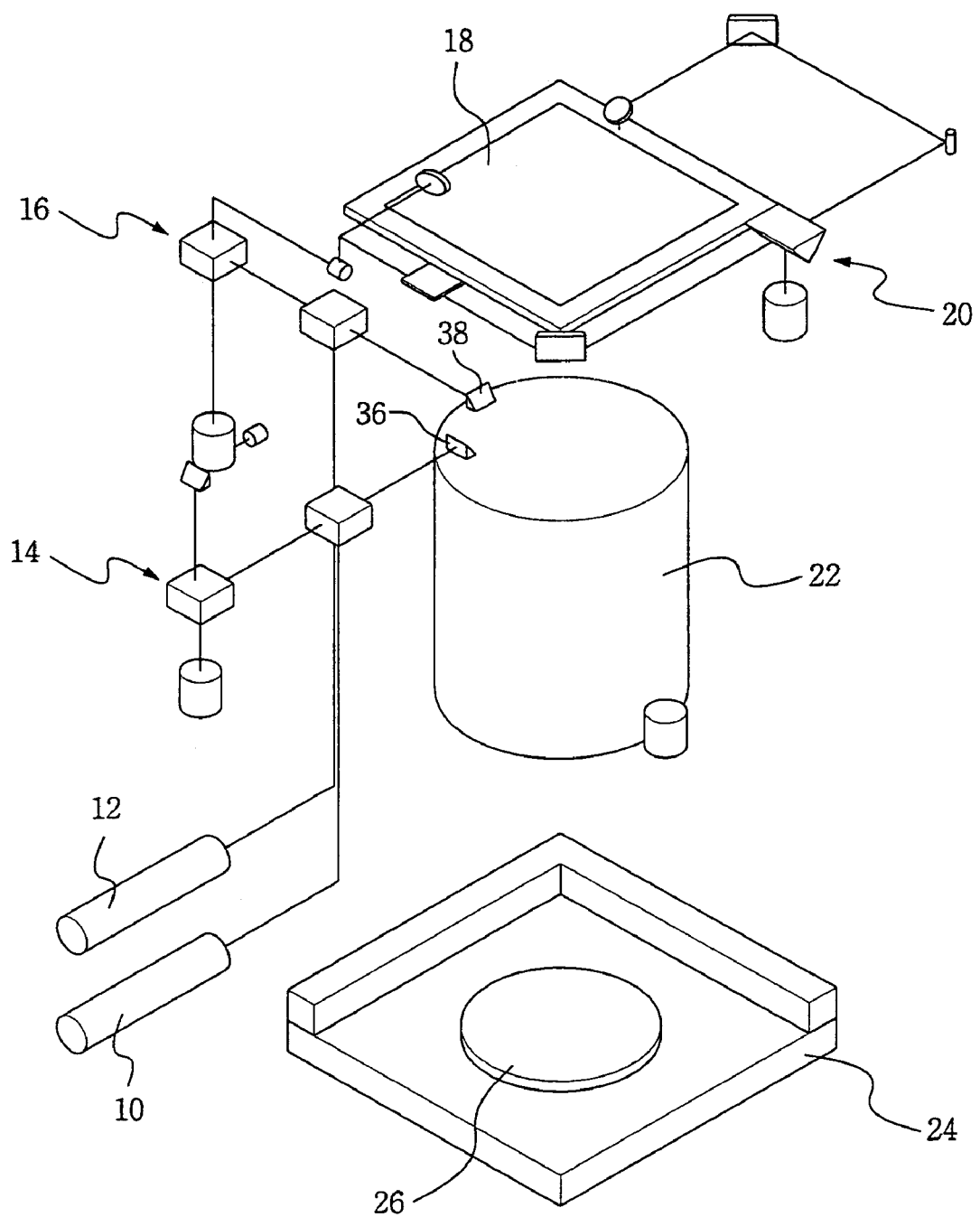
FIG. 1 illustrates a conventional exposure device for use in manufacturing a semiconductor device.
Figure 2:
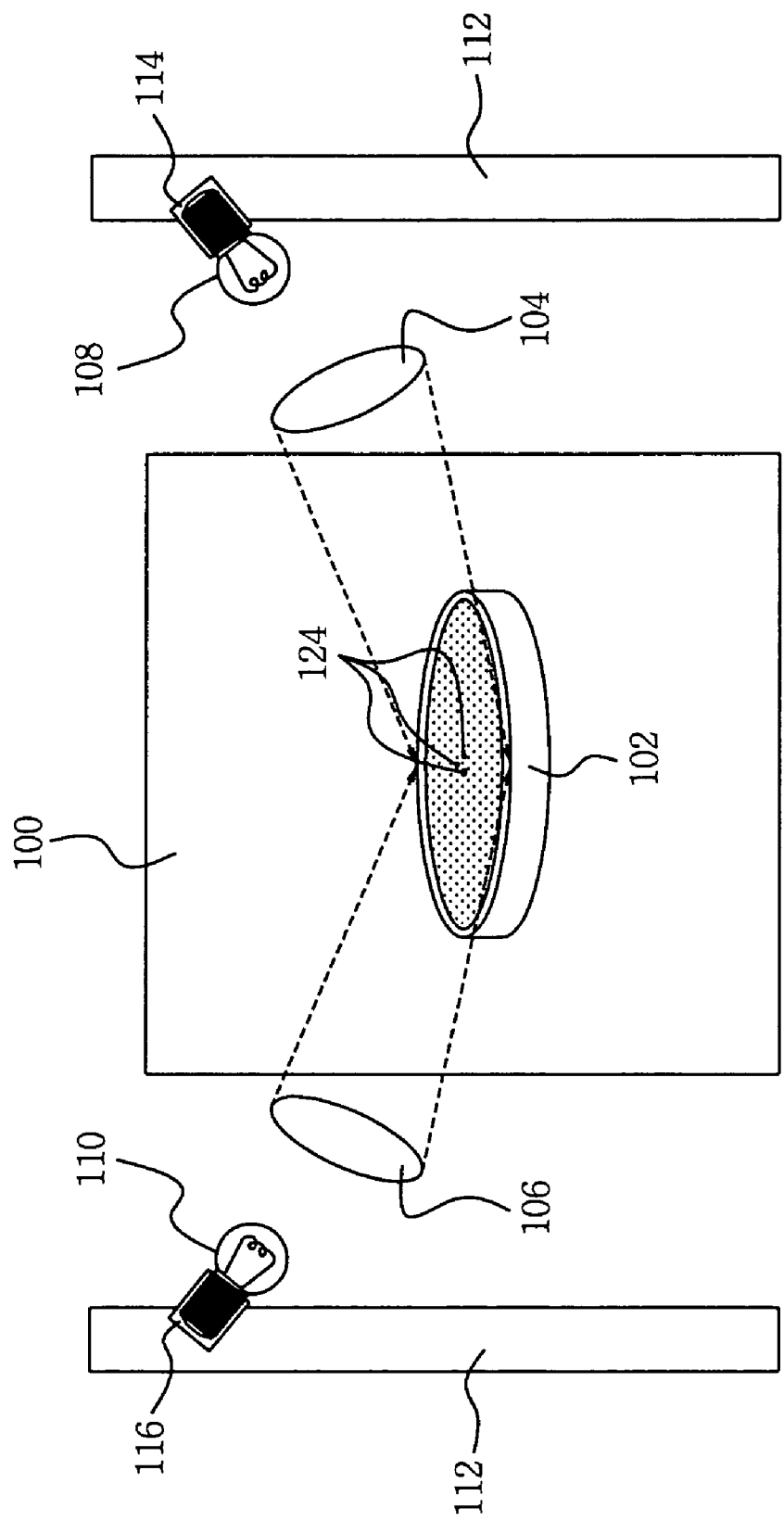
FIG. 2 is a perspective view of a wafer chuck illumination device for use in semiconductor manufacturing equipment according to an exemplary embodiment of the invention.
Figure 3:
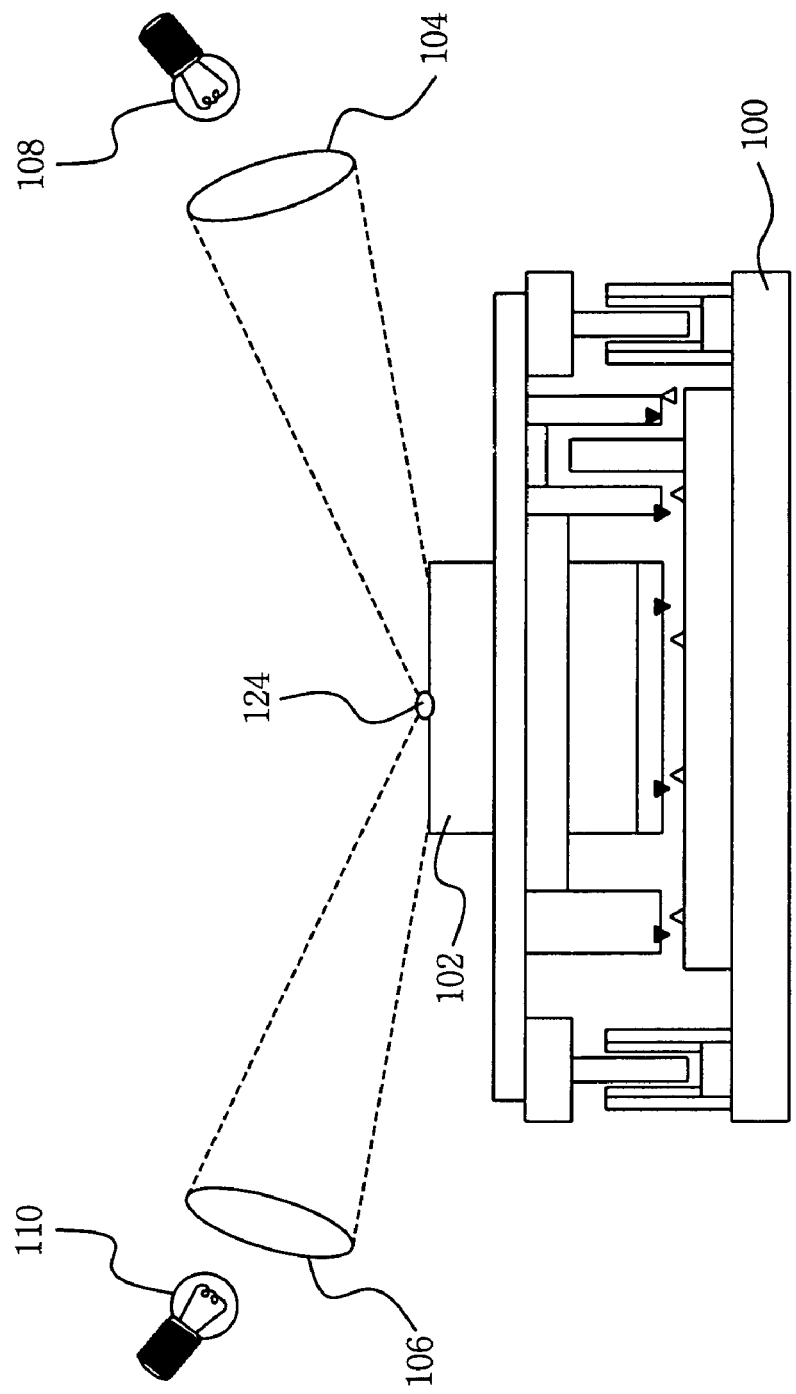
FIG. 3 is a sectional view of the wafer chuck illumination device.

Referring to FIGS. 2 and 3, a wafer chuck illumination device includes a wafer chuck 102, a wafer stage 100, an equipment inner wall 112, a first socket 114, a second socket 116, first and second lamps 108 and 110, and first and second collimator lenses 104 and 106.

Semiconductor wafers are mounted on the wafer chuck 102 so that the wafers may be exposed. The wafer stage 100 is provided with the wafer chuck 102, and moves the wafer chuck 102 forward and backward, right and left, upward and downward and in a tilt direction, etc. to an exposure position and cleaning working position. The first socket 114 is installed on one side of the equipment inner wall 112. The second socket 116 is installed on another side of the equipment inner wall 112.

The first and second lamps 108 and 110 are each fastened to the first and second sockets 114 and 116, to generate a white light source. The first and second collimator lenses 104 and 106 transform a light source irradiated from the first and second lamps 108 and 110 to a beam of parallel rays, and penetrate the beam of parallel rays through the wafer chuck 102.

Figure 4:
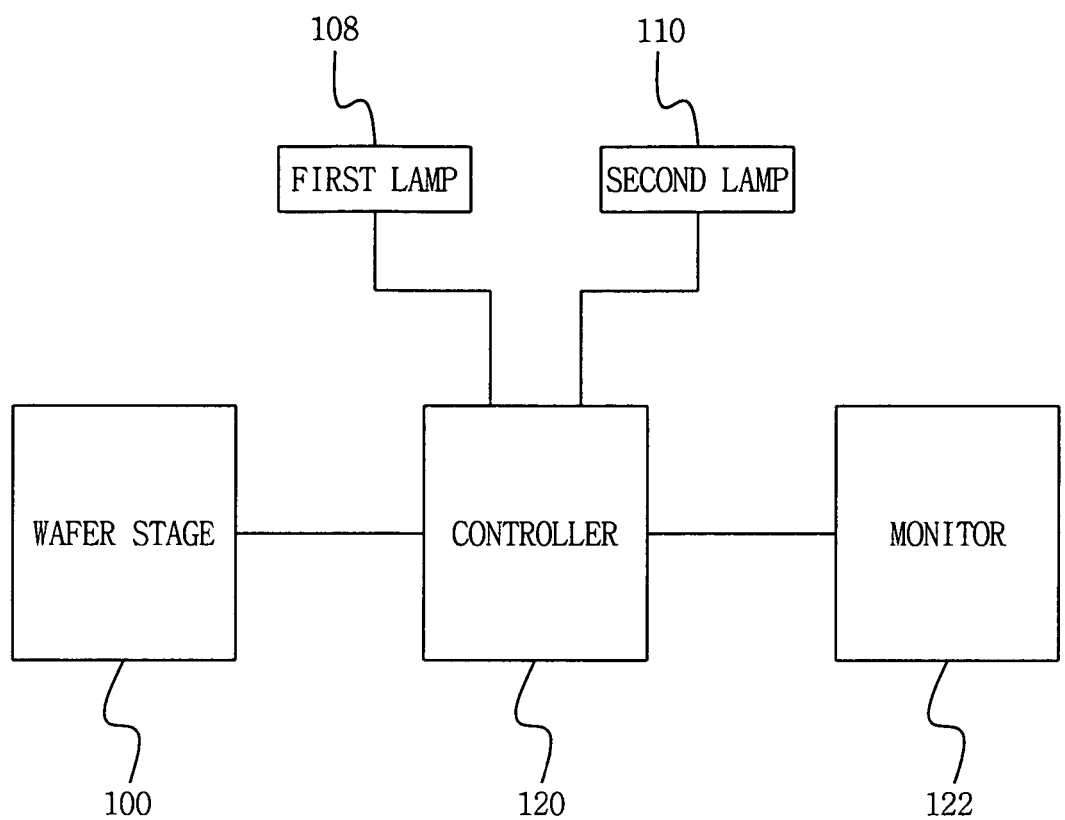
FIG. 4 is a block diagram illustrating driving a lamp according to an exemplary embodiment of the invention.

FIG. 4 is a schematic block diagram illustrating driving a lamp for irradiating a light source to the wafer chuck according to another exemplary embodiment of the invention.

With reference to FIG. 4, a wafer chuck illumination device includes the wafer stage 100, a controller 120 and a monitor 122. The wafer stage 100 is provided with the wafer chuck 102 on which wafers to be exposed are mounted, and moves the wafer chuck 102 forward and backward, right and left, upward and downward and in a tilt direction, etc. to an exposure position and a cleaning working position.

The controller 120 moves the wafer stage 100 to the cleaning working position when a drive command for cleaning the wafer chuck 102 is performed, and then drives the first and second lamps 108 and 110 for outputting a lamp drive signal.

The monitor 122 displays a screen for selecting several kinds of commands to be controlled by the controller 120 and provides the controller 120 with the command selected on the screen.

Figure 5A:
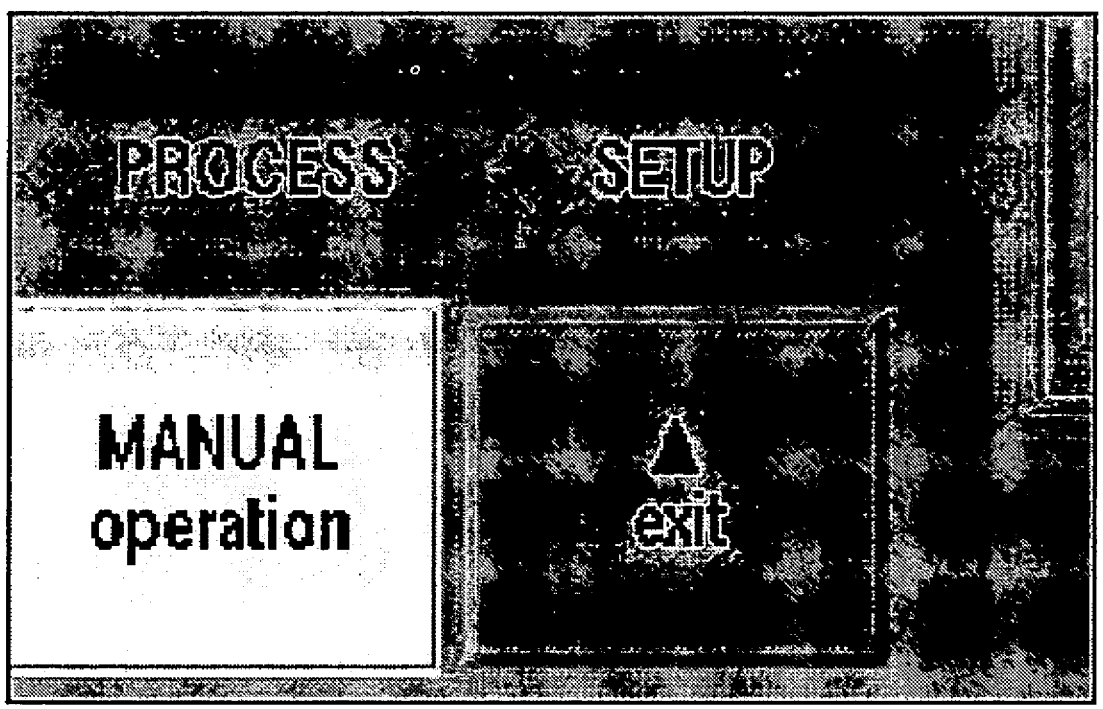
FIGS. 5a and 5b are screens illustrating commands to be selected according to an exemplary embodiment of the invention.
Figure 5B:
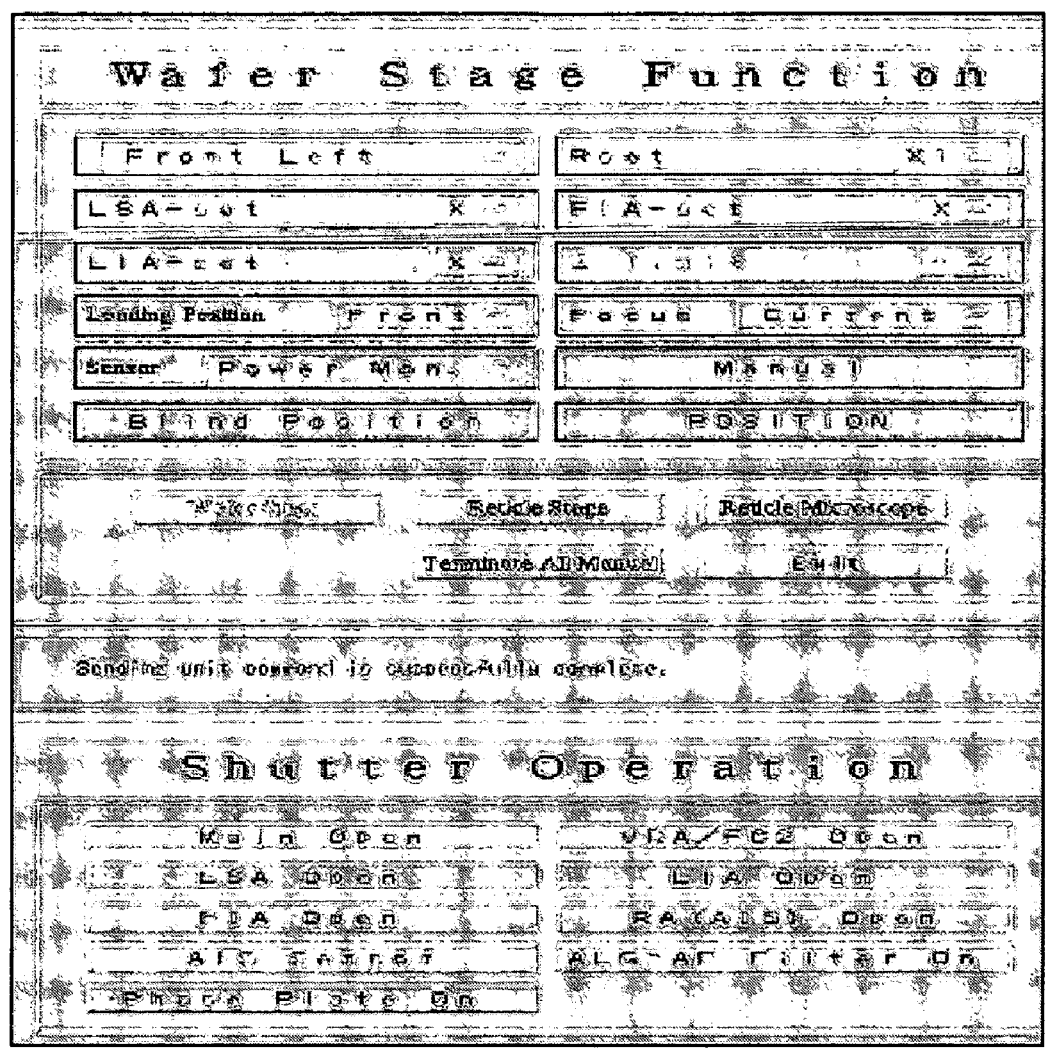

FIGS. 5a and 5b are screens illustrating commands to be selected according to an exemplary embodiment of the invention. Referring to FIGS. 5a and 5b, an operation of the exemplary embodiments of FIGS. 2-4 will be described in detail.

The controller 120 displays on the monitor 122 a screen for selecting a command as shown in FIG. 5a. At this time, when, for example, a user, selects a manual operation command displayed on the monitor 122, the controller 120 displays sub commands for an execution of several kinds of commands on the screen as shown in FIG. 5b. When the user selects a white light command by using a mouse or cursor, the controller 120 drives the wafer stage 100 to move the wafer chuck 102 to the cleaning working position. When a transfer of the wafer chuck 102 to the cleaning working position is completed, the controller 120 lights the first and second lamps 108 and 110.

When the first and second lamps 108 and 110 are lighted, a light source, which is irradiated from the first and second lamps 108 and 110, is turned into a beam of parallel rays after passing through the first and second collimator lenses 104 and 106, and is then directed to the wafer chuck 102. Thus, the user can locate and remove foreign substances 124 on/from the wafer chuck 102 because the parallel light is diffusedly reflected by the foreign substances 124 that have, for example, diffracting or reflecting properties that are different than the wafer chuck 102.

Though one exemplary embodiment of the invention provides lighting the first and second lamps 108 and 110 after moving the wafer stage 100 to the cleaning working position, the first and second lamps 108 and 110 may also be lighted after moving the wafer stage 100 to the cleaning working position when a user manually manipulates a switch.

Though another exemplary embodiment of the invention provides lighting the first and second lamps 108 and 110 after moving the wafer stage 100 to the cleaning working position so that a light source generated from the first and second lamps 108 and 110 is transformed to a beam of parallel rays through the first and second collimator lenses 104 and 106 and is then irradiated to the wafer chuck 102; a light source generated from the first and second lamps 108 and 110 without passing through the first and second collimator lenses 104 and 106 may be directly radiated.

As described above, according to an exemplary embodiment of the invention, a lamp is turned on after moving a wafer chuck to a cleaning working position by driving a wafer stage in exposure equipment for use in manufacturing a semiconductor device, and then light is irradiated onto the wafer chuck, thereby a user can locate and clean a position of foreign substances by using light diffusedly reflected by the wafer chuck. The position of foreign substances can be easily found without using an instrument such as a flashlight, etc. In addition, damage to or pollution of the equipment caused by improper use of the instrument can be prevented.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A wafer chuck illumination device for use in semiconductor manufacturing equipment, the device comprising:
   a first lamp for generating a first white light source;
   a first collimator lens for transforming the first white light source into a first beam of parallel rays of white light and for directing the first beam of parallel rays of white light to a wafer chuck;
   a second lamp for generating a second white light source; and
   a second collimator lens for transforming the second white light source into a second beam of parallel rays of white light and for directing the second beam of parallel rays of white light to the wafer chuck.

2. The device of claim 1, wherein the first beam of parallel rays of white light is reflected by a foreign substance on the wafer chuck.

3. The device of claim 1, wherein the second beam of parallel rays of white light is reflected by a foreign substance on the wafer chuck.

4. The device of claim 1, further comprising:
   a switch for turning one of the first and second lamps on or off.

5. The device of claim 1, further comprising:
   a wafer stage for moving the wafer chuck to a cleaning position.

6. The device of claim 5, wherein the wafer stage moves the wafer chuck in one of a forward, backward, right, left, upward, downward, and tilt direction.

7. The device of claim 1, further comprising:
   a first socket for providing power to the first lamp, wherein the first socket is mounted on an inner wall of the semiconductor manufacturing equipment; and
   a second socket for providing power to the second lamp, wherein the second socket is mounted on an inner wall of the semiconductor manufacturing equipment opposite the inner wall on which the first socket is mounted.

8. A wafer chuck illumination device for use in semiconductor manufacturing equipment, the device comprising:
   a wafer stage for moving a wafer chuck to one of an exposure position and a cleaning position;
   a controller for outputting a lamp drive signal after moving the wafer stage to the cleaning position when a drive command for cleaning the wafer chuck is performed;
   a lamp for generating a white light source in response to the lamp drive signal;
   a collimator lens for transforming the white light source into a beam of parallel rays of white light and for directing the beam of parallel rays of white light to the wafer chuck; and
   a monitor for displaying selectable commands on a screen for control by the controller, and for providing the controller with a command selected by a user from the displayed commands.

9. The device of claim 8, wherein the beam of parallel rays of white light is reflected by a foreign substance on the wafer chuck.

10. The device of claim 8, wherein the wafer chuck is located on the wafer stage.

11. The device of claim 8, wherein the wafer stage moves the wafer chuck in one of a forward, backward, fight, left, upward, downward, and tilt direction.

12. The device of claim 8, wherein wafers to be exposed to the beam of parallel rays of white light are mounted on the wafer chuck.

13. A wafer chuck illumination device for use in semiconductor manufacturing equipment, the device comprising:
    a wafer stage for moving a wafer chuck to one of an exposure position and a cleaning position;
    a first lamp for generating a first white light source and for irradiating the first white light source to the wafer chuck, wherein the first lamp is mounted on an inner wall of the semiconductor manufacturing equipment; and
    a second lamp for generating a second white light source and for irradiating the second white light source to the wafer chuck, wherein the second lamp is mounted on an inner wall of the semiconductor manufacturing equipment that is opposite the inner wall on which the first lamp is mounted.

14. The device of claim 13, wherein the first white light source is reflected by a foreign substance on the wafer chuck.

15. The device of claim 13, wherein the second white light source is reflected by a foreign substance on the wafer chuck.

* * * * *